(12) United States Patent
Celinski et al.

(10) Patent No.: US 8,970,815 B2
(45) Date of Patent: Mar. 3, 2015

(54) METALLIC SURFACES AS ALIGNMENT LAYERS FOR NONDISPLAY APPLICATIONS OF LIQUID CRYSTALS

(71) Applicant: The Regents of the University of Colorado, Denver, CO (US)

(72) Inventors: Zbigniew Celinski, Colorado Springs, CO (US); Robert Camley, Colorado Springs, CO (US); Yuri Garbovskiy, Colorado Springs, CO (US); Anatoliy Glushchenko, Colorado Springs, CO (US)

(73) Assignee: The Regents of the University of Colorado, Denver, CO (US)

( * ) Notice: Subject to any disclaimer, the term of this patent is extended or adjusted under 35 U.S.C. 154(b) by 197 days.

(21) Appl. No.: 13/766,615

(22) Filed: Feb. 13, 2013

(65) Prior Publication Data

US 2013/0208194 A1    Aug. 15, 2013

Related U.S. Application Data

(60) Provisional application No. 61/598,454, filed on Feb. 14, 2012.

(51) Int. Cl.
*G02F 1/1337*    (2006.01)
*H03C 7/02*    (2006.01)
*G02F 1/13*    (2006.01)

(52) U.S. Cl.
CPC ............... *H03C 7/02* (2013.01); *G02F 1/1313* (2013.01)
USPC .......................... 349/123; 349/124; 349/126

(58) Field of Classification Search
CPC ............ G02F 1/1337; G02F 1/133711; G02F 1/134363; G02F 1/133753; G02F 1/133784; G02F 1/141
USPC ............................... 349/123, 124, 126
See application file for complete search history.

(56) References Cited

U.S. PATENT DOCUMENTS 7,324,175 B2 *  1/2008  Inoue et al. ................... 349/110
7,518,683 B2 *  4/2009  Inoue et al. ................... 349/129

* cited by examiner

*Primary Examiner* — Mike Qi
(74) *Attorney, Agent, or Firm* — Marsh Fischmann & Breyfogle LLP; Daniel J. Sherwinter

(57) ABSTRACT

Systems and methods are described for producing liquid crystal devices microwave that use metal alignment layers. The liquid crystal microwave devices include a liquid crystal layer sandwiched between metal layers, which are further sandwiched between substrate layers. At least one of the metal layers is rubbed to form micro-grooves that tend to align the liquid crystal molecules adjacent to those layers without using additional rubbed polymeric layers for the alignment. The thickness of the metal layers can be selected to yield a desired electromagnetic effect, such as constraint of propagation of microwave radiation.

20 Claims, 6 Drawing Sheets

US 8,970,815 B2

METALLIC SURFACES AS ALIGNMENT LAYERS FOR NONDISPLAY APPLICATIONS OF LIQUID CRYSTALS

CROSS-REFERENCE TO RELATED APPLICATION

This application is a non-provisional of, and claims the benefit of the filing date of, U.S. Provisional Pat. Appl. No. 61/598,454, entitled "METALLIC SURFACES AS ALIGNMENT LAYERS FOR NONDISPLAY APPLICATIONS OF LIQUID CRYSTALS," filed Feb. 14, 2012, the entire disclosure of which is incorporated herein by reference.

STATEMENT REGARDING FEDERALLY SPONSORED RESEARCH AND DEVELOPMENT

This invention was made with government support under grant numbers W911NF-04-1-0247 and W911NF-10-1-0225 awarded by the U.S. Army Research Office. The government has certain rights in the invention.

FIELD

This application relates generally to liquid crystals. More specifically, this application relates to the use of metallic surfaces as alignment layers for non-display applications of liquid crystals.

BACKGROUND

The ability to align liquid crystalline ("LC") molecules homogeneously by various surfaces is an important factor determining their use in a variety of applications. For decades, research into liquid crystals and alignment of their molecules has primarily focused on visible spectrum applications, like displays. These applications typically employ transparent liquid crystalline optical elements driven by an external electric field.

Recently, non-visible-spectrum liquid crystal applications have begun to attract attention. Illustrative applications of this type include liquid crystalline tunable microwave devices, such as phased array antennas, tunable capacitors, phase shifters, delay lines, and others. Microwave and infrared liquid crystal devices operate using cells bounded by metallic surfaces (copper, silver, and gold). This is in distinct contrast to optical devices that exploit transparent surfaces, such as indium tin oxide (ITO) glasses and transparent polyimides. Research into and development of these non-visible-spectrum liquid crystal applications has tended to be confined to a relatively small number of companies and universities.

BRIEF SUMMARY

Among other things, systems and methods are described for producing liquid crystal devices microwave that use metal alignment layers. The liquid crystal microwave devices include a liquid crystal layer sandwiched between metal layers, which are further sandwiched between substrate layers. At least one of the metal layers is rubbed to form microgrooves that tend to align the liquid crystal molecules adjacent to those layers without using additional rubbed polymeric layers for the alignment. The thickness of the metal layers can be selected to yield a desired electromagnetic effect, such as constraint of propagation of microwave radiation. In one embodiment, the metal layers are copper layers, each having a thickness of approximately two microns, or at least three times a skin depth of the metal material with respect to a particular microwave frequency (or frequency range).

According to one set of embodiments, a liquid crystal microwave device is provided. The device includes a liquid crystal cell, a first microwave environment configured to output microwave radiation, a second microwave environment configured to receive microwave radiation, an input port configured to interface between the first microwave environment and the liquid crystal cell and to propagate the microwave radiation from the first microwave environment into the liquid crystal cell, and an output port configured to interface between the second microwave environment and the liquid crystal cell and to propagate the microwave radiation to the second microwave environment from the liquid crystal cell. The liquid crystal cell includes: a first substrate layer and a second substrate layer; a first metal layer deposited on the first substrate layer and a second metal layer deposited on the second substrate layer; and a liquid crystal layer sandwiched between the first and second metal layers, such that liquid crystal molecules of the liquid crystal layer are in contact with a first exposed surface of the first metal layer and a second exposed surface of the second metal layer, the first exposed surface including one-directional micro-grooves that cause at least some of the liquid crystal molecules to align substantially with the first exposed surface.

According to another set of embodiments, a non-display liquid crystal cell is provided. The cell includes: a first substrate layer and a second substrate layer; a first metal layer deposited on the first substrate layer and a second metal layer deposited on the second substrate layer; and a liquid crystal layer sandwiched between the first and second metal layers, such that liquid crystal molecules of the liquid crystal layer are in contact with a first exposed surface of the first metal layer and a second exposed surface of the second metal layer, the first exposed surface including one-directional microgrooves that cause at least some of the liquid crystal molecules to align substantially with the first exposed surface.

According to yet another set of embodiments, a method is provided for forming a non-display liquid crystal cell. The method includes: depositing a first metal layer on a first substrate layer; depositing a second metal layer on a second substrate layer; rubbing a first exposed surface of the first metal layer in a first rubbing direction to form microgrooves in the first exposed surface; and introducing liquid crystal between the first and second metal layers to form a liquid crystal layer sandwiched therebetween, causing at least some liquid crystal molecules of the liquid crystal layer to be in contact with the first exposed surface of the first metal layer and to be aligned by the microgrooves in the first exposed surface.

BRIEF DESCRIPTION OF THE DRAWINGS

The present disclosure is described in conjunction with the appended figures.

In the appended figures, similar components and/or features can have the same reference label. Further, various components of the same type can be distinguished by following the reference label by a second label that distinguishes among the similar components. If only the first reference label is used in the specification, the description is applicable to any one of the similar components having the same first reference label irrespective of the second reference label.

DETAILED DESCRIPTION

It is typically desirable in electromagnet applications of liquid crystals to align at least some of the liquid crystal molecules within a layered structure to control propagation of radiation in different ways. For example, in a traditional display application, the liquid crystal is sandwiched between layers of glass coated with a transparent oxide (e.g., indium tin oxide (ITO)) and layers of relatively soft, transparent polyimide. The polyimide layer is rubbed to form micro-grooves and anisotropic molecular chains, both of which tend to align adjacent liquid crystal molecules. By applying a voltage across the cell, the alignment of the liquid crystal molecules can be affected, which can, in turn, change the permittivity of the cell, the propagation of electromagnetic radiation through the cell, etc.

Figure 1:
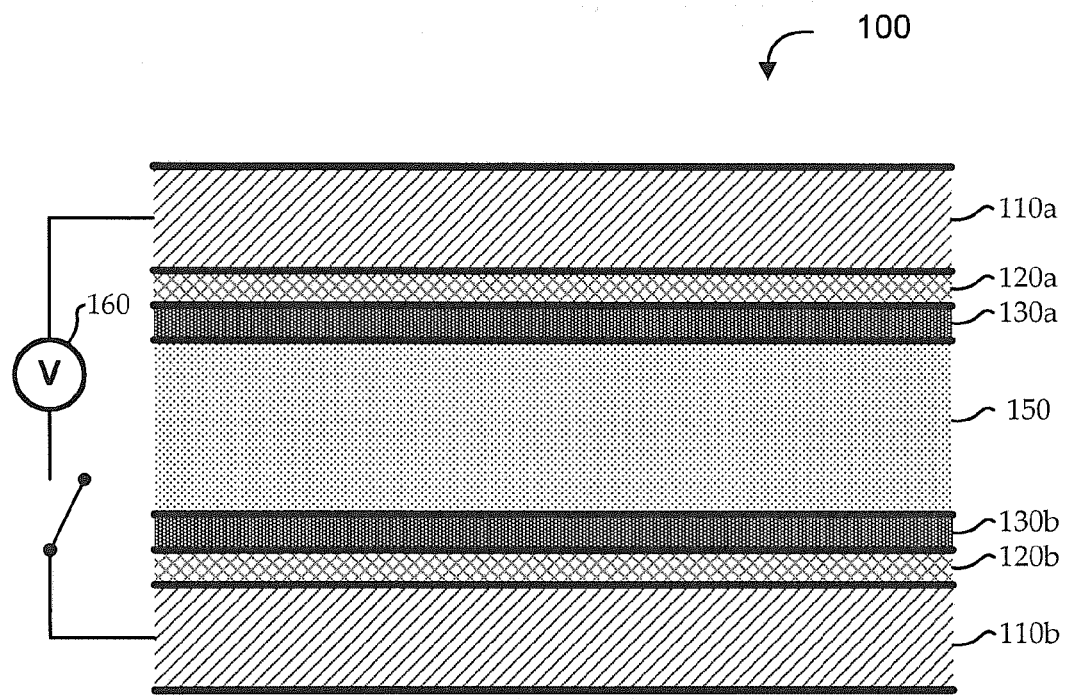
FIG. 1 shows a traditional display-type of liquid crystal cell.

For example, FIG. 1 shows a traditional display-type of liquid crystal cell 100. Glass layers 110 form outer layers of the liquid crystal cell 100. The glass layers 110 are coated with thin oxide layers 120 (e.g., made of ITO). The next layers are the polymeric layers 130, which are used as alignment layers as described above. The polymeric alignment layers 130 are rubbed to achieve their desired alignment effect. The polymeric alignment layers 130 are adjacent to the liquid crystal layer 150 in the middle of the liquid crystal cell 100. Though not shown, cells used in display or other applications can have additional layers, such as electrode layers, masking layers, polarization layers, etc. Electrodes can be coupled with the oxide-coated glass for use in applying a voltage 160 across the cell.

In the relatively nascent field of non-visible-spectrum liquid crystal devices (e.g., liquid crystalline tunable microwave devices, such as phased array antennas, tunable capacitors, phase shifters, delay lines, and others), certain design parameters of the cells is similar to those of their visible-spectrum counterparts, while other design parameters are different. For example, in both applications, it is desirable to align the liquid crystal molecules in much the same manner, it is desirable to apply a voltage across the cell to affect propagation of electromagnetic radiation, etc. However, in display applications, visible radiation is selectively permitted to pass through layers of the cell using various transparent materials; while in microwave applications, it is typically desired to constrain the microwave propagation to remain substantially within the liquid crystal layer of the cell.

As discussed below, constraining of microwave propagation can be accomplished by bounding the liquid crystal layer with metallic surfaces (e.g., made of pure metals, like copper, silver, or gold). This is in distinct contrast to display-types of devices that exploit transparent indium tin oxide (ITO) layers, transparent polyimide layers, and other such materials. Still, to realize the type of liquid crystal molecule alignment found in decades of display-type liquid crystal cells, non-display applications, like microwave devices, have continued to use polymeric layers for alignment. Accordingly, current liquid crystal microwave devices have tended to include metal layers to constrain microwave propagation and rubbed polymeric layers to align the liquid crystal molecules.

Embodiments described herein eliminate the polymeric layer and, instead, use the metallic layers themselves for alignment of the liquid crystal molecules. Indeed, polymeric layers have been used as alignment layers in liquid crystal microwave devices for a number of reasons. One such reason is that, as described above, polymers (e.g., polyimide) have been used for alignment in other liquid crystal applications for decades, and they are considered to be a standard and reliable alignment mechanism in the art. Accordingly, they have tended to be adopted without question in other, newer liquid crystal applications. Another such reason is that it is relatively simple to make polymeric layers with desired characteristics, like transparency, softness (i.e., so it is easy to rub them to form micro-grooves for alignment), etc. In contrast, metal tends to be relatively hard and less conducive to micro-groove formation. Yet another such reason is that rubbing the polymers forms micro-grooves and anisotropic molecular chains, both of which tend to assist with aligning the liquid crystal molecules. In contrast, rubbing metal does not form anisotropic molecular chains.

Elimination of the polymeric layers can yield appreciably simplified device constructions. For example, a number of processing steps can be avoided, including deposition of the polyimide layer, prebake, and final baking steps. This can reduce processing time by almost 50 percent in some instances. Further, elimination of the rubbed polymers can achieve improved performance of the device and other features. For example, rubbed polymers can trap charge, which can absorb energy from radiation propagating through the cell and can adversely impact application of an electrical field across the cell (e.g., can affect smoothness of dependence of phase shift on voltage).

In the following description, numerous specific details are set forth to provide a thorough understanding of various embodiments. However, one having ordinary skill in the art should recognize that the invention can be practiced without these specific details. In some instances, circuits, structures, and techniques have not been shown in detail to avoid obscuring the present invention.

Figure 2:
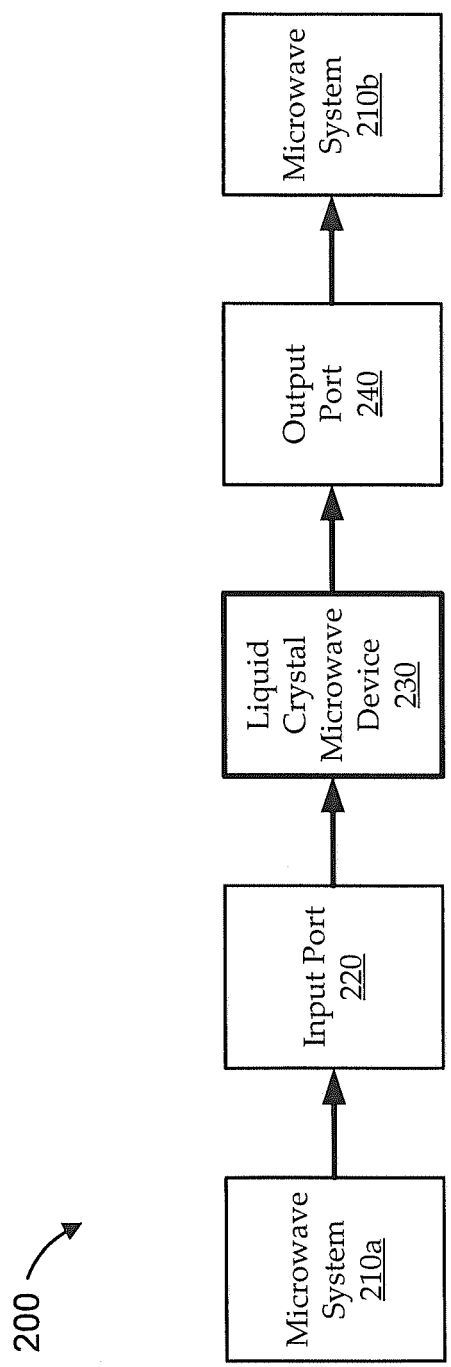
FIG. 2 shows a simplified block diagram of a microwave environment that provides a context for various embodiments.

Turning to FIG. 2, a simplified block diagram is shown of a microwave environment 200 that provides a context for various embodiments. The microwave environment 200 includes a first microwave system 210a, an input port 220, a liquid crystal microwave device 230, an output port 240, and a second microwave system 210b. The first and second microwave systems 210 can be two portions of the same system or two different systems in communication via the liquid crystal microwave device 230.

For the sake of illustration, the first microwave system 210a is a first portion of a communications system having microwave signals propagating through a coaxial cable. The coaxial cable is coupled with the input port 220, which can be any suitable port for interfacing between the coaxial cable and the liquid crystal microwave device 230. For example, the input port 220 is a lunger, part of a micro-strip, part of a waveguide, etc. The microwave signals are communicated from the first microwave system 210a, through the input port 220, and into the liquid crystal microwave device 230. The liquid crystal microwave device 230 can be a phased array antenna, tunable capacitor, phase shifter, delay line, or any other suitable, liquid-crystalline-tunable microwave device. The liquid crystal microwave device 230 can affect the microwave signal, while constraining its propagation through the device, for example, between the input port 220 and the output port 240. The output port 240 is any suitable port for interfacing between the liquid crystal microwave device 230 and the second microwave system 210b. For example, the output port 240 permits the affected microwave signal to propagate from the liquid crystal microwave device 230 into another coaxial cable in communication with a second portion of the communications system.

Figure 3:
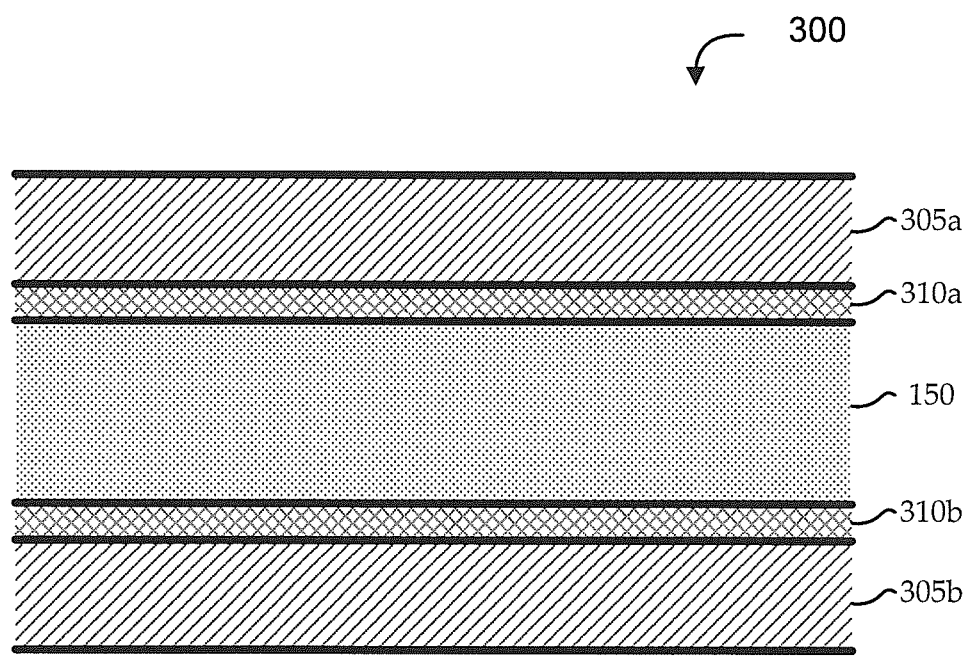
FIG. 3 shows an illustrative liquid crystal cell, according to various embodiments.

FIG. 3 shows an illustrative liquid crystal cell 300, according to various embodiments. The liquid crystal cell 300 can be an implementation of the liquid crystal microwave device 230 of FIG. 2. Embodiments of the liquid crystal cell 300 include a liquid crystal layer 150 sandwiched between metal layers 310 deposited on substrate layers 305. The substrate layers 305 can include glass, plastic, ITO-coated glass, or any other suitable material. The liquid crystal layer 150 can be selected and sized for suitable microwave properties. For example, fiber spaces of the liquid crystal layer 150 can have a thickness of 10-50 microns. These thicker types of liquid crystal cells can tend to reduce losses in the metallic bounding films for microwave devices.

Metal layers 310 are deposited onto the substrate layers 305 in any suitable manner. For example, metallic films, such as copper or silver films, are sputtered onto titanium-coated glass wafers to form metal layers 310 having a thicknesses of about two microns and a mirror-like finish. One or both metal layers 310 are rubbed to create micro-grooves for alignment of adjacent liquid crystal molecules. Various rubbing techniques are described in the art, for example, in U.S. Pat. No. 4,165,923, the entire disclosure of which is incorporated herein by reference for all purposes. For example, techniques include rubbing the alignment surfaces with velvet in one direction. The inventors experimentally determined that formation of adequate micro-grooves in metal for liquid crystal alignment (e.g., as compared to polyimide or other polymers) involved increased rubbing of the metal layers 310. For example, additional rubbing time and/or pressure can be used to form sufficient micro-grooves in the metal layers 310 for liquid crystal alignment.

Throughout various experiments the inventors investigated several types of sandwich-like cells were made, for example: liquid crystal sandwiched between a layer of non-rubbed metal and a layer of ITO-coated glass; liquid crystal sandwiched between a layer of rubbed metal and a layer of ITO-coated glass; liquid crystal sandwiched between two layers of rubbed metal (with anti-parallel rubbing directions of the two rubbed-metal layers; liquid crystal sandwiched between two layers of non-rubbed metal; and liquid crystal sandwiched between a layer of rubbed metal and a layer of non-rubbed metal. These were compared against various types of reference cells, such as liquid crystal sandwiched between two layers ITO-coated glass covered with rubbed polyimide; and liquid crystal sandwiched between two layers of ITO-coated glass without rubbed polyimide. Additionally, various commercially available, nematic liquid crystals (e.g., LC 13739) were used to study alignment properties of the various metallic films. Through these and other experiments, the inventors have shown that rubbed metal layers 310 themselves can strongly orient the liquid crystal molecules even absent an extra organic (e.g., polymeric) layer. For example, homeotropic alignment was observed for copper and silver metal layers 310, and parallel alignment was observed for chromium and gold metal layers 310. Furthermore, the spatial extent of the alignment has not been examined.

Various techniques were employed to study alignment of the liquid crystal molecules in different experimental structures, including using polarizing optical microscopy and capacitance measurements. Some illustrative dielectric measurement results are described below. Almost all tunable liquid crystal microwave devices adjust the dielectric susceptibility of liquid crystals by applying an external voltage. Accordingly, direct measurements of dielectric permittivity using cells like the one illustrated in FIG. 3 (i.e., a liquid crystal layer 150 sandwiched between metal alignment layers 310) allow a clear determination of whether a metallic surface can align liquid crystals homogeneously enough to be used without covering them with an additional polymeric aligning layer (i.e., in these cell structures, the alignment of the liquid crystal molecules is caused only by the metallic surfaces).

Figure 4A:
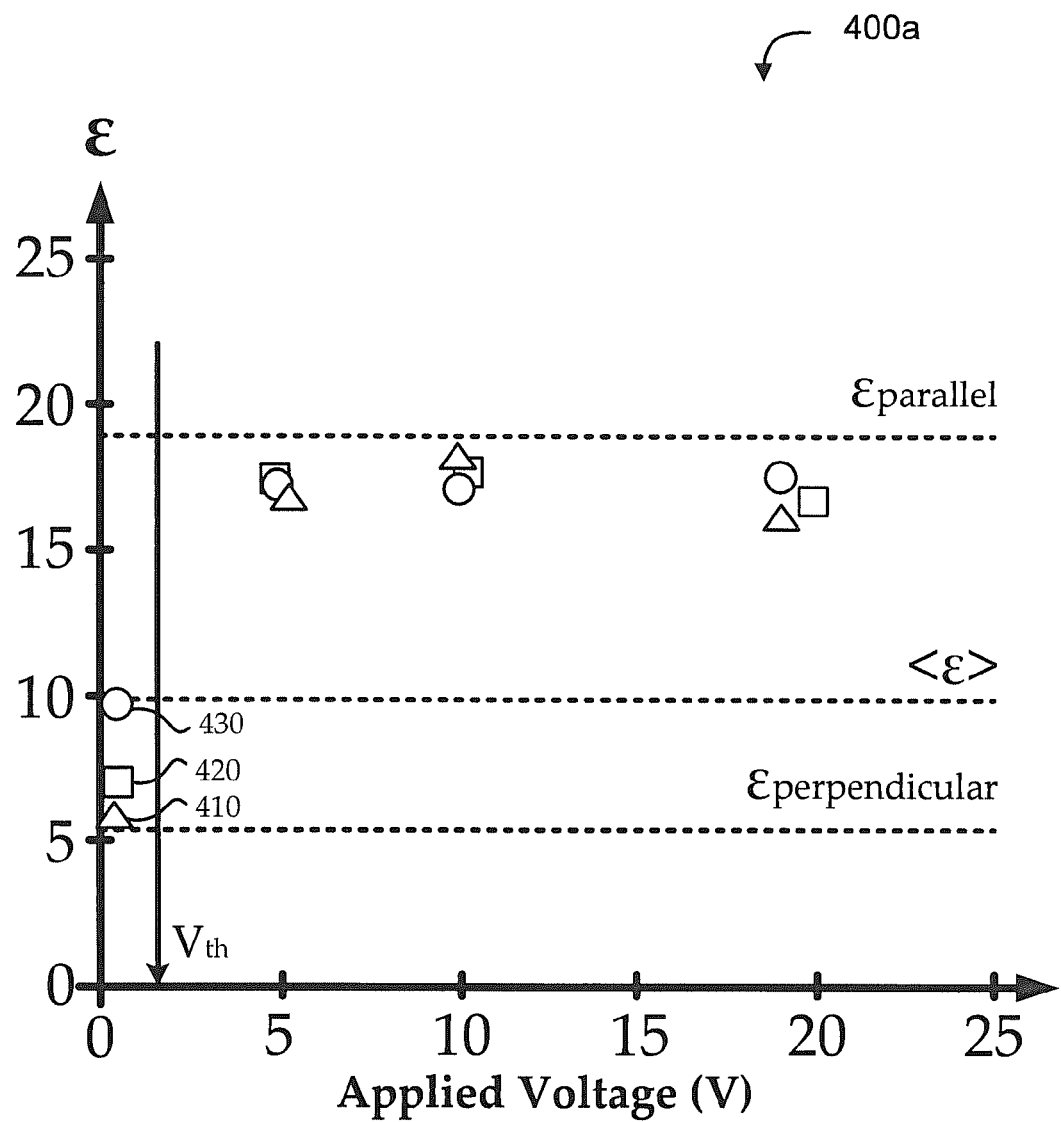
FIGS. 4A and 4B show dielectric permittivity ($\in$) of a selected type of nematic liquid crystal as a function of an applied voltage for different illustrative structures.
Figure 4B:
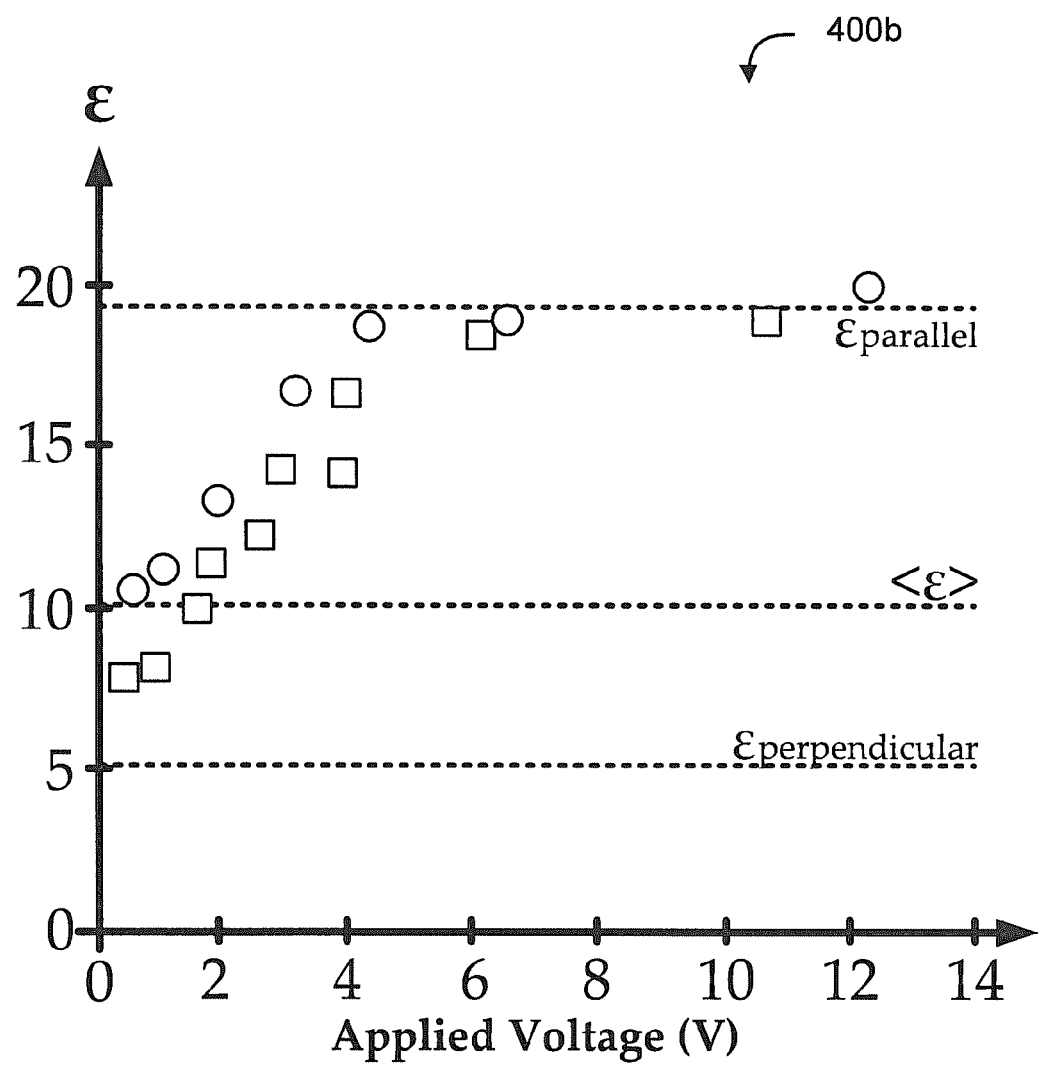

FIGS. 4A and 4B show dielectric permittivity ($\in$) of a selected type of nematic liquid crystal as a function of an applied voltage for different illustrative structures. In FIG. 4A, a vertical line indicates the nominal threshold voltage value of the liquid crystals (e.g., around 2 volts). Horizontal dashed lines on FIGS. 4A and 4B indicate a typical dielectric permittivity of the liquid crystals when the molecules are not aligned ($<\in>$), a typical dielectric permittivity of the liquid crystals when the molecules are in alignment with the surface of the alignment layer (thereby manifesting a perpendicular electric field with a permittivity of $\in\_perpendicular$), and a typical dielectric permittivity of the liquid crystals when the molecules are aligned perpendicular to the surface of the alignment layer (thereby manifesting a parallel electric field with a permittivity of $\in\_parallel$). These values are taken from M. Schadt and F. Muller, IEEE Trans. Electron Devices 25, 1125 (1978), the entire disclosure of which is incorporated herein by reference for all purposes.

In some applications, it is desirable to maximize a permittivity difference between a first state of the liquid crystal when no voltage is applied across the cell and a second state of the liquid crystal when a voltage in excess of the threshold voltage is applied. It is noted that the typical difference between $\in\_parallel$ and $\in\_perpendicular$ is approximately fifty-percent greater than the difference between $\in\_parallel$ and $<\in>$. Accordingly, being able to force the liquid crystal molecules into an alignment when no voltage is applied (e.g., using metal alignment layers) can appreciably increase the magnitude of change in permittivity that can be realized from the device over a device that has non-aligned liquid crystal molecules when no voltage is applied.

In FIG. 4A, squares indicate values for cells having the liquid crystal sandwiched between two layers of rubbed silver, circles indicate values for cells having the liquid crystal sandwiched between two layers of non-rubbed copper, and triangles indicate values for cells having the liquid crystal sandwiched between two layers of rubbed copper. The cell thickness is approximately fifty microns. As illustrated, when less than the threshold voltage is applied to the cell (e.g., no voltage), the cell having non-rubbed metal layers performed close to the literature value for structures having non-aligned liquid crystal molecules ($<\in>$), while the cells having rubbed metal layers performed close to the literature value for structures having aligned liquid crystal molecules ($\in\_perpendicular$). In particular, the literature value for $\in\_perpendicular$ is 5.4 when a long axis of the liquid crystal molecules is parallel to the rubbed surface, so that the electric field in the resulting capacitor structure is perpendicular to that axis. The experimental result for the rubbed copper is approximately 5.4, and the experimental result for the rubbed silver is approximately 6.8.

When a voltage in excess of the threshold voltage is applied, the liquid crystal molecules start to reorient from planar to homeotropic, so that the long axis of the liquid crystal molecules becomes perpendicular to the surface and parallel to the applied electric field. As illustrated, regardless of the starting alignment of the liquid crystal molecules or the type of cell used, all the permittivity values manifest similar behavior. The values indicate performances close to the literature value for structures having parallel-aligned liquid crystal molecules ($\in$_parallel), as expected. At higher applied voltages (e.g., greater than around ten volts), the liquid crystal molecules tend to be completely reoriented from planar to homeotropic, and the measured values of the dielectric permittivity (e.g., around 19 or 20) correspond to the literature values for $\in$_parallel.

FIG. 4B illustrated experimental findings that even one rubbed metallic surface can partially align the liquid crystal molecules. Squares indicate values for cells having the liquid crystal sandwiched between one layer of rubbed copper and one layer of non-rubbed copper, and circles indicate values for cells having the liquid crystal sandwiched between two layers of non-rubbed copper. Again, the cell thickness is approximately fifty microns. Unlike the clear difference in permittivity on either side of the threshold applied voltage level shown in FIG. 4A, FIG. 4B shows more of a ramp in permittivity as the applied voltage changes from about zero to five volts. Still, when no (or very low) voltage is applied, the cell having the single rubbed metal layer (indicated by the squares) manifests a permittivity that is lower than $<\in>$ and lower than that of the cell having no rubbed surfaces (though still higher than $\in$_perpendicular). Accordingly, there is still some alignment of the liquid crystal and some effect therefrom. Further, the ramp-like response can be desirable in certain applications.

While only limited experimental results are shown, many other studies were performed by the inventors with other cell structures, other nematic liquid crystals, etc. The results consistently indicated that the rubbed metallic surfaces of metal layers aligned the liquid crystal molecules in-plane. Thus, the inventors found it to be generally applicable that unidirectional rubbing of metallic surfaces provides a homogeneous planar alignment of nematic liquid crystals, which can advantageously be used for various non-display applications of liquid crystals, including for tunable liquid crystal signal processing devices in non-visible electromagnetic spectrums.

Figure 5:
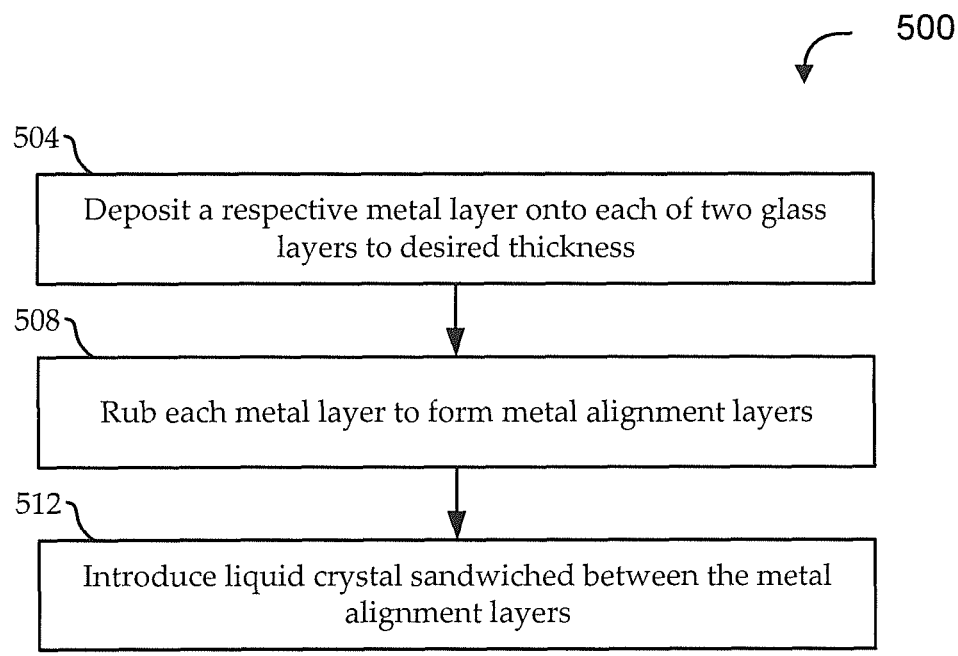
FIG. 5 shows a flow diagram of an illustrative method for producing a liquid crystal cell having metal alignment layers, according to various embodiments.

Turning to FIG. 5, a flow diagram is shown of an illustrative method 500 for producing a liquid crystal cell having metal alignment layers, according to various embodiments. Embodiments of the method 500 begin at stage 504 by depositing a metal layer onto each of at least two substrate layers. As discussed above, the substrate layers can include any suitable material, such as glass or plastic. The metal layers can be pure metal, such as copper, silver, or gold, and can be deposited in any suitable manner. For example, the metal can be sputtered onto the substrate layers to form a mirror-like finish. The thickness of the metal layers can be determined to suit a desired purpose with respect, for example, to electromagnetic radiation. In some implementations, the metal layers are intended to contain propagation of radiation in a designated frequency band. The thickness of the metal layer can be determined, then, according to a skin depth of the type of metal being as a function of the designated frequency band (e.g., the metal layer thickness can be approximately three times the skin depth). For example, for copper being used with microwave radiation, the appropriate metal layer thickness may be approximately 2 microns.

Each metal layer formed in stage 504 can be rubbed in stage 508 to form a metal alignment layer. For example, the surface of one or both metal layers is rubbed in a single direction with cloth (e.g., velvet) to form micro-grooves in the surface. In some implementations, a machine is used to rub the surface for a particular amount of time, with particular force, etc. Where both metal layers are rubbed, they can be rubbed in parallel, anti-parallel, or any other suitable directions.

The layers can be assembled with a gap left for introduction of the liquid crystal. At stage 512, the liquid crystal is introduced into the cell in such a way that it is sandwiched between the metal layers. The contact of the micro-grooves on the surface of the metal layers in contact with the liquid crystal can tend to align at least some of the liquid crystal molecules when the liquid crystal is introduced at stage 512.

The methods disclosed herein include one or more actions for achieving the described method. The method and/or actions can be interchanged with one another without departing from the scope of the claims. In other words, unless a specific order of actions is specified, the order and/or use of specific actions can be modified without departing from the scope of the claims. The various operations of methods and functions of certain system components described above can be performed by any suitable means capable of performing the corresponding functions.

Other examples and implementations are within the scope and spirit of the disclosure and appended claims. For example, features implementing functions can also be physically located at various positions, including being distributed such that portions of functions are implemented at different physical locations. Also, as used herein, including in the claims, "or" as used in a list of items prefaced by "at least one of" indicates a disjunctive list such that, for example, a list of "at least one of A, B, or C" means A or B or C or AB or AC or BC or ABC (i.e., A and B and C). Further, the term "exemplary" does not mean that the described example is preferred or better than other examples.

Various changes, substitutions, and alterations to the techniques described herein can be made without departing from the technology of the teachings as defined by the appended claims. Moreover, the scope of the disclosure and claims is not limited to the particular aspects of the process, machine, manufacture, composition of matter, means, methods, and actions described above. Processes, machines, manufacture, compositions of matter, means, methods, or actions, presently existing or later to be developed, that perform substantially the same function or achieve substantially the same result as the corresponding aspects described herein can be utilized. Accordingly, the appended claims include within their scope such processes, machines, manufacture, compositions of matter, means, methods, or actions.

What is claimed is:

1. A non-display liquid crystal cell comprising:
    a first substrate layer and a second substrate layer;
    a first metal layer deposited on the first substrate layer and a second metal layer deposited on the second substrate layer; and
    a liquid crystal layer sandwiched between the first and second metal layers, such that liquid crystal molecules of the liquid crystal layer are in contact with a first exposed surface of the first metal layer and a second exposed surface of the second metal layer,
    the first exposed surface including one-directional micro-grooves that cause at least some of the liquid crystal molecules to align substantially with the first exposed surface.

2. The non-display liquid crystal cell of claim 1, wherein the second exposed surface is a non-rubbed metallic surface.

3. The non-display liquid crystal cell of claim 1, wherein the second exposed surface includes one-directional micro-grooves that cause at least some of the liquid crystal molecules to align substantially with the second exposed surface.

4. The non-display liquid crystal cell of claim 3, wherein the one-directional micro-grooves of the second exposed surface are anti-parallel with the one-directional micro-grooves of the first exposed surface.

5. The non-display liquid crystal cell of claim 1, wherein at least one of the first or second metal layer has a thickness selected according to its skin depth for a predetermined electromagnetic frequency band.

6. The non-display liquid crystal cell of claim 5, wherein the predetermined electromagnetic frequency band is a microwave frequency band.

7. The non-display liquid crystal cell of claim 1, wherein at least one of the first or second metal layer has a thickness of between one and three microns.

8. The non-display liquid crystal cell of claim 1, wherein at least one of the first or second metal layer comprises a pure metal selected from the group consisting of chromium, silver, gold, and copper.

9. The non-display liquid crystal cell of claim 1, wherein the liquid crystal layer has a thickness of between ten and fifty microns.

10. The non-display liquid crystal cell of claim 1, wherein at least one of the first or second substrate layer comprises glass.

11. The non-display liquid crystal cell of claim 10, wherein at least a portion of the glass is coated with an oxide layer.

12. A method for forming a non-display liquid crystal cell, the method comprising:
   depositing a first metal layer on a first substrate layer;
   depositing a second metal layer on a second substrate layer;
   rubbing a first exposed surface of the first metal layer in a first rubbing direction to form microgrooves in the first exposed surface; and
   introducing liquid crystal between the first and second metal layers to form a liquid crystal layer sandwiched therebetween, causing at least some liquid crystal molecules of the liquid crystal layer to be in contact with the first exposed surface of the first metal layer and to be aligned by the microgrooves in the first exposed surface.

13. The method of claim 12, wherein at least other liquid crystal molecules of the liquid crystal layer are in contact with a second exposed surface of the second metal layer, and the second exposed surface is a non-rubbed metallic surface.

14. The method of claim 12, further comprising:
   rubbing a second exposed surface of the second metal layer in a second rubbing direction to form microgrooves in the second exposed surface,
   wherein at least other liquid crystal molecules of the liquid crystal layer are in contact with the second exposed surface of the second metal layer, and are aligned by the microgrooves in the second exposed surface.

15. The method of claim 14, wherein the first rubbing direction and the second rubbing direction are anti-parallel.

16. The method of claim 12, wherein at least one of the first or second metal layer is deposited to a thickness selected according to its skin depth.

17. The method of claim 12, wherein at least one of the first or second substrate layer comprises glass, and further comprising:
   coating the glass with an oxide layer.

18. The method of claim 12, wherein:
   causing at least some liquid crystal molecules of the liquid crystal layer to be aligned by the microgrooves in the first exposed surface comprises causing a long axis of the at least some liquid crystal molecules to be substantially parallel to the rubbed surface, such that an electric field in a resulting capacitor structure is substantially perpendicular to the long axis.

19. The method of claim 12, further comprising:
   applying a voltage in excess of a threshold voltage across the liquid crystal layer, causing a long axis of the at least some liquid crystal molecules to be substantially homeotropically aligned with the rubbed surface, such that an electric field in a resulting capacitor structure is substantially parallel to the long axis.

20. A liquid crystal microwave device comprising:
   a liquid crystal cell comprising:
      a first substrate layer and a second substrate layer;
      a first metal layer deposited on the first substrate layer and a second metal layer deposited on the second substrate layer; and
      a liquid crystal layer sandwiched between the first and second metal layers, such that liquid crystal molecules of the liquid crystal layer are in contact with a first exposed surface of the first metal layer and a second exposed surface of the second metal layer,
      the first exposed surface including one-directional micro-grooves that cause at least some of the liquid crystal molecules to align substantially with the first exposed surface;
   a first microwave environment configured to output microwave radiation;
   a second microwave environment configured to receive microwave radiation;
   an input port configured to interface between the first microwave environment and the liquid crystal cell and to propagate the microwave radiation from the first microwave environment into the liquid crystal cell; and
   an output port configured to interface between the second microwave environment and the liquid crystal cell and to propagate the microwave radiation to the second microwave environment from the liquid crystal cell.

* * * * *